(12) United States Patent
Hwang et al.

(10) Patent No.: US 11,276,798 B2
(45) Date of Patent: Mar. 15, 2022

(54) DISPLAY DEVICE

(71) Applicant: SAMSUNG ELECTRONICS CO., LTD., Suwon-si (KR)

(72) Inventors: Kyungwook Hwang, Hwaseong-si (KR); Sungjin Kang, Seoul (KR); Junsik Hwang, Hwaseong-si (KR); Junhee Choi, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 51 days.

(21) Appl. No.: 16/822,673

(22) Filed: Mar. 18, 2020

(65) Prior Publication Data
US 2021/0091257 A1 Mar. 25, 2021

(30) Foreign Application Priority Data

Sep. 24, 2019 (KR) .......................... 10-2019-0117488

(51) Int. Cl.
H01L 33/00 (2010.01)
H01L 25/075 (2006.01)
H01L 33/50 (2010.01)
H01L 33/62 (2010.01)

(52) U.S. Cl.
CPC ...... H01L 33/0095 (2013.01); H01L 25/0753 (2013.01); H01L 33/507 (2013.01); H01L 33/62 (2013.01)

(58) Field of Classification Search
CPC ............. H01L 33/0095; H01L 25/0753; H01L 33/507; H01L 33/62; H01L 2224/95136; H01L 33/60; H01L 25/167; H01L 33/48; H01L 33/486; H01L 33/502; H01L 27/156; H01L 33/0045; H01L 2224/0344
See application file for complete search history.

(56) References Cited

U.S. PATENT DOCUMENTS

| 10,497,744 | B2 | 12/2019 | Lee et al. | |
| 10,546,793 | B2* | 1/2020 | Chang | ..................... H01L 22/22 |
| 10,741,739 | B2* | 8/2020 | He | .......................... H01L 33/36 |
| 2014/0159043 | A1 | 6/2014 | Sakariya et al. | |
| 2014/0159064 | A1 | 6/2014 | Sakariya et al. | |
| 2014/0367705 | A1 | 12/2014 | Bibi et al. | |
| 2016/0336304 | A1* | 11/2016 | Wu | ..................... H01L 21/6835 |
| 2017/0125392 | A1 | 5/2017 | Bibl et al. | |
| 2017/0133357 | A1 | 5/2017 | Kuo et al. | |

(Continued)

FOREIGN PATENT DOCUMENTS

CN 108461438 A 8/2018
ER 3 487 269 A1 5/2019

(Continued)

OTHER PUBLICATIONS

Communication dated Aug. 11, 2020, issued by the European Patent Office in counterpart European Application No. 20152918.7.

Primary Examiner — Victor A Mandala
(74) Attorney, Agent, or Firm — Sughrue Mion, PLLC

(57) ABSTRACT

Provided is a display device including a substrate, a transfer guiding mold provided on the substrate and including a plurality of openings, and a plurality of micro light emitting diodes (LEDs) provided on the substrate in the plurality of openings, wherein a height of the transfer guiding mold is less than twice a height of each of the plurality of micro LEDs.

13 Claims, 12 Drawing Sheets

(56) References Cited

U.S. PATENT DOCUMENTS

2017/0133550 A1\* 5/2017 Schuele .............. H01L 33/0093
2018/0090058 A1 3/2018 Chen et al.
2019/0319015 A1\* 10/2019 Schuele .............. H01L 25/0753

FOREIGN PATENT DOCUMENTS

| JP | 11-338385 A | 12/1999 |
| JP | 3201365 U | 12/2015 |
| KR | 10-2018-0011404 A | 2/2018 |
| WO | 2017/007770 A2 | 1/2017 |

\* cited by examiner

DISPLAY DEVICE

CROSS-REFERENCE TO RELATED APPLICATION

This application claims priority to Korean Patent Application No. 10-2019-0117488, filed on Sep. 24, 2019, in the Korean Intellectual Property Office, the disclosure of which is incorporated herein in its entirety by reference.

BACKGROUND

1. Field

Example embodiments of the present disclosure relate to display devices, and more particularly, to display devices including a transfer guiding mold configured to increase the transfer efficiency of micro light emitting diodes (LEDs).

2. Description of Related Art

Liquid crystal displays (LCDs) and organic light emitting diode (OLED) displays are widely used as display devices. Recently, a technology of manufacturing a high-resolution display device using a micro-light emitting diode (LED) has attracted attention. To manufacture the high-resolution display device, a method of arranging LED chips with high efficiency manufactured in the form of a micro chip in proper positions of a substrate using a transfer process is used.

SUMMARY

One or more example embodiments provide display devices including a transfer guiding mold capable of increasing the transfer efficiency of micro light emitting diodes (LEDs).

Additional aspects will be set forth in part in the description which follows and, in part, will be apparent from the description, or may be learned by practice of the example embodiments.

According to an aspect of an example embodiment, there is provided a display device including a substrate, a transfer guiding mold provided on the substrate and including a plurality of openings, and a plurality of micro light emitting diodes (LEDs) provided on the substrate in the plurality of openings, wherein a height of the transfer guiding mold is less than twice a height of each of the plurality of micro LEDs.

The display device may further include a plurality of driving circuits configured to drive the plurality of micro LEDs, respectively, wherein each of the plurality of driving circuits are provided on the substrate and a portion of each of the plurality of driving circuits are exposed through the plurality of openings, respectively, of the transfer guiding mold.

The plurality of micro LEDs may be provided to be spaced apart from the transfer guiding mold.

The display device may further include a first reflective layer provided on the transfer guiding mold between the plurality of micro LEDs.

The display device may further include a second reflective layer provided on an inner wall of an opening provided in the transfer guiding mold.

The display device may further include a concave-convex structure provided on an upper surface of the transfer guiding mold.

The display device may further include a plurality of unit pixels each including a plurality of pixels of different colors.

Each of the plurality of unit pixels may include two or more pixels of a same color.

The plurality of pixels of different colors may include a plurality of micro LEDs configured to emit light of different wavelength bands.

The plurality of pixels of different colors may include a plurality of micro LEDs configured to emit light of a same wavelength band, and at least some of the plurality of micro LEDs are provided with a photoconversion material layer configured to convert a wavelength of an incidence light.

The display device may further include a barrier provided on an upper portion of the transfer guiding mold, the barrier being configured to receive the photoconversion material layer.

The display device may further include a reflective layer provided on an inner wall of the barrier.

A height of the barrier may be greater than the height of the transfer guiding mold.

According to another aspect of an example embodiment, there is provided a display device including a substrate, a transfer guiding mold provided on the substrate and including a plurality of openings, a plurality of micro light emitting diodes (LEDs) provided on the substrate in the plurality of openings, and a first reflective layer provided on the transfer guiding mold between the plurality of micro LEDs.

The display device may further include a groove of a predetermined depth provided in the transfer guiding mold between the plurality of micro LEDs, wherein the first reflective layer may be provided on an inner wall of the groove.

The display device may further include a second reflective layer provided on an inner wall of the plurality of openings provided in the transfer guiding mold.

The display device may further include a concave-convex structure provided on an upper surface of the transfer guiding mold.

The display device may further include a plurality of unit pixels each including a plurality of pixels of different colors.

The plurality of pixels of different colors may include a plurality of micro LEDs configured to emit light of a same wavelength band, and at least some of the plurality of micro LEDs are provided with a photoconversion material layer configured to convert a wavelength of an incidence light.

The display device may further include a barrier provided on an upper portion of the transfer guiding mold, the barrier being configured to receive the photoconversion material layer.

According to another aspect of an example embodiment, there is provided a display device including a substrate, a transfer guiding mold provided on the substrate and including a plurality of openings, and a plurality of micro light emitting diodes (LEDs) provided on the substrate in the plurality of openings, a first reflective layer provided on the transfer guiding mold between the plurality of micro LEDs, and wherein a second reflective layer provided on an inner wall of each of the plurality of openings.

A height of the transfer guiding mold is 0.5 to 1.5 times a height of each of the plurality of micro LEDs.

The display device may further include a concave-convex structure provided on an upper surface of the transfer guiding mold

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
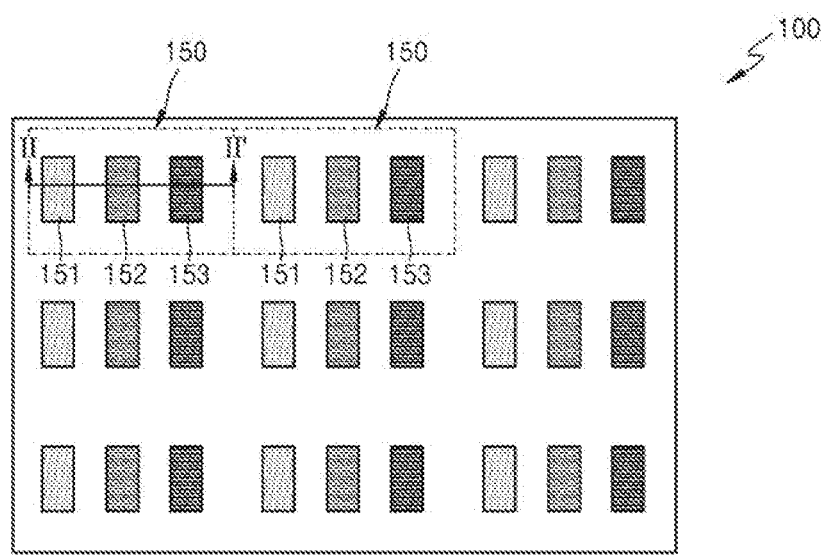
FIG. 1 is a plan view schematically illustrating a display device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The thickness or size of each layer illustrated in the drawings may be exaggerated for convenience of explanation and clarity. In this regard, the example embodiments may have different forms and should not be construed as being limited to the descriptions set forth herein.

Hereinafter, when a constituent element is disposed "above" or "on" to another constituent element, the constituent element may be only directly on the other constituent element or above the other constituent elements in a non-contact manner. The terms such as "comprise" and/or "comprising" may be construed to denote a constituent element, but may not be construed to exclude the existence of or a possibility of addition of another constituent element.

The use of the terms "a" and "an" and "the" and similar referents in the context of describing the disclosure are to be construed to cover both the singular and the plural. Also, operations of all methods described herein may be performed in any suitable order unless otherwise indicated herein or otherwise clearly contradicted by context. The present disclosure is not limited to the described order of the operations. The use of any and all examples, or language (e.g., "such as") provided herein, is intended merely to better illuminate the disclosure and does not pose a limitation on the scope of the disclosure unless otherwise claimed.

FIG. 1 is a plan view schematically illustrating a display device 100 according to an example embodiment.

Referring to FIG. 1, the display device 100 may include a plurality of unit pixels 150. For example, the nine unit pixels 150 are illustrated in FIG. 1. Here, in order for the display device 100 to implement a color image, each of the plurality of unit pixels 150 may include pixels 151, 152, and 153 of different colors. For example, each of the unit pixels 150 may include the first pixel 151, a second pixel 152, and a third pixel 153 of different colors. For example, the first pixel 151, the second pixel 152, and the third pixel 153 may be respectively a blue pixel, a green pixel, and a red pixel. However, the first pixel 151, the second pixel 152, and the third pixel 153 are not limited thereto.

Figure 2:
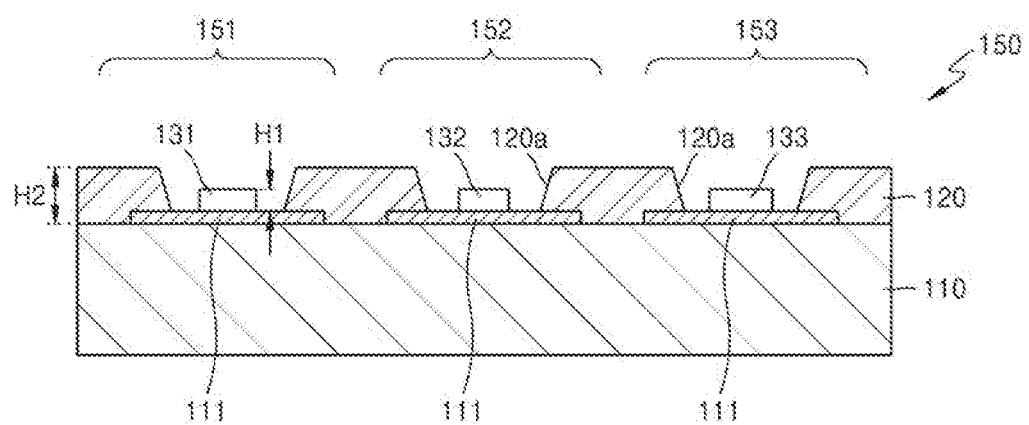
FIG. 2 is a cross-sectional view taken along a line II-II' of FIG. 1.

FIG. 2 is a cross-sectional view taken along a line II-II' of FIG. 1.

Referring to FIG. 2, the unit pixel 150 may include a substrate 110, a transfer guiding mold 120, and a plurality of micro light emitting diodes (LEDs) 131, 132, and 133. Here, each of the micro LEDs 131, 132, and 133 may be a light emitting diode that emits light of a specific color and is manufactured in the form of a micro chip of a micro size. One surface of each of the micro LEDs 131, 132, and 133 may be provided with a p-type electrode and an n-type electrode in electrical contact with a driving circuit 111 that will be described later. Each of the micro LEDs 131, 132, and 133 may constitute one pixel in the display device 100.

The substrate 110 may include, for example, a glass substrate or a silicon substrate. However, this is merely an example and other substrates of various materials may be used. The substrate 110 may be provided with driving circuits 111 for driving the plurality of micro LEDs 131, 132, and 133.

The transfer guiding mold 120 may be provided on the upper surface of the substrate 110. Here, the transfer guiding mold 120 may be configured to guide the movement of the micro LEDs 131, 132, and 133 in a process of transferring the micro LEDs 131, 132, and 133 of a specific color to the substrate 110. To this end, openings 120a for receiving the micro LEDs 131, 132, and 133 may be formed in the transfer guiding mold 120. Here, a portion exposed through the opening 120a of the transfer guiding mold 120 may have an area corresponding to approximately one micro LED 131, 132, or 133.

The driving circuits 111 provided in the substrate 110 may be exposed through the openings 120a of the transfer guiding mold 120. The transfer guiding mold 120 may include, for example, a polymer. For example, the transfer guiding mold 120 may include a photoresist. However, this is merely an example. The transfer guiding mold 120 may be manufactured by, for example, photoresist patterning, etching, molding, or the like, but is not limited thereto.

The plurality of micro LEDs 131, 132, and 133 may be provided on the upper surface of the substrate 110. For example, the plurality of micro LEDs 131, 132, and 133 may be provided on the driving circuits 111 of the substrate 110 exposed by the openings 120a of the transfer guiding mold 120. Here, each of the micro LEDs 131, 132, and 133 may be provided such that electrodes provided on a lower surface of each of the micro LEDs 131, 132, and 133 contact the driving circuit 111.

The plurality of micro LEDs 131, 132, and 133 may include the first micro LED 131, the second micro LED 132, and the third micro LED 133 that emit light of different wavelength bands. The first micro LED 131 may emit light of a color corresponding to the first pixel 151. For example, the first micro LED 131 may emit blue light. The second micro LED 132 may emit light of a color corresponding to the second pixel 152. For example, the second micro LED 132 may emit green light. The third micro LED 133 may emit light having a color corresponding to the third pixel 153. For example, the third micro LED 133 may emit red light.

Figure 3:
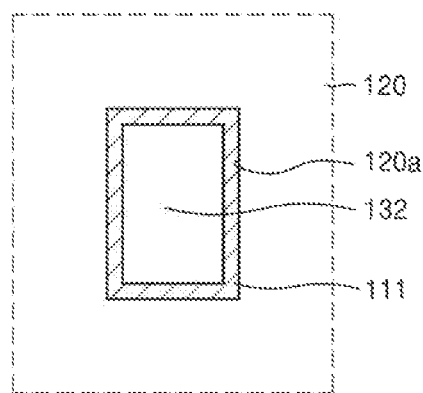
FIG. 3 illustrates a plan view illustrating a periphery of a micro light emitting diode (LED) of FIG. 2.

The plurality of micro LEDs 131, 132, and 133 may be provided inside each of the openings 120a of the transfer guiding mold 120. Here, the plurality of micro LEDs 131, 132, and 133 may be provided to be spaced apart from the transfer guiding mold 120. FIG. 3 illustrates an example of a plan view illustrating a periphery of the second micro LED 132. Referring to FIG. 3, the second micro LED 132 may be provided inside the transfer guiding mold 120. Here, the second micro LED 132 may be positioned to be spaced apart from the transfer guiding mold 120. In addition, like the second micro LED 132, the first and third micro LEDs 131 and 133 may be positioned to be spaced apart from the transfer guiding mold 120 inside the opening 120a of the transfer guiding mold 120.

Figure 4:
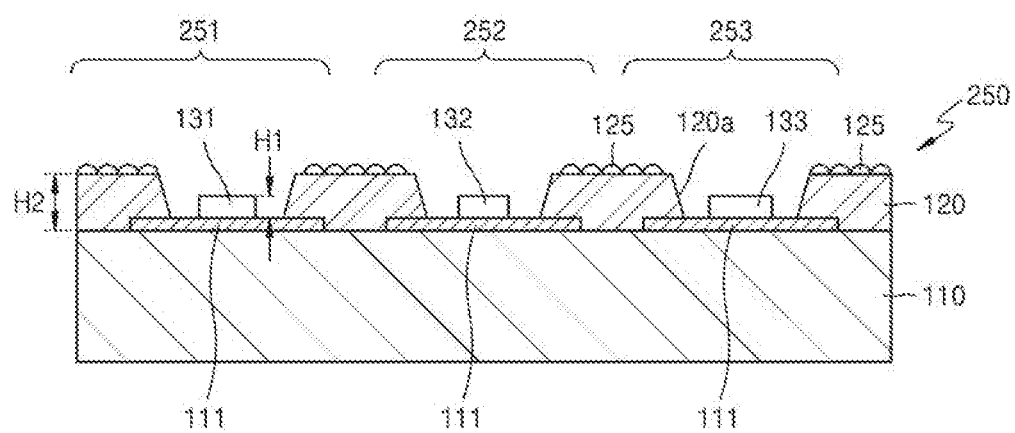
FIG. 4 illustrates a display device according to another example embodiment.

Referring to FIG. 4, in the example embodiment, a height H2 of the transfer guiding mold 120 may be smaller than twice a height H1 of the micro LEDs 131, 132, and 133. For example, the height H2 of the transfer guiding mold 120 may be about 0.5 to about 1.5 times the height H1 of the micro LEDs 131, 132, and 133. However, the height H2 of the transfer guiding mold 120 is not limited thereto. As described above, the height H2 of the transfer guiding mold 120 may be smaller than twice the height H1 of the micro LEDs 131, 132, and 133 such that the micro LEDs 131, 132, and 133 provided at positions away from a target position on the substrate 110 after a transfer process may be more easily removed.

In the manufacture of the display device 100, the micro LEDs 131, 132, and 133 of a specific color dispersed in the solution through the transfer process may be moved to the target position on the substrate 110. Here, the micro LEDs 131, 132, and 133 may be more accurately positioned at the target position using the transfer guiding mold 120 provided on the substrate 110.

When performing the transfer process, the micro LEDs 131, 132, and 133 may be positioned in the positions deviated from the target position. For example, the two or more micro LEDs 131, 132, and 133 may overlap each other inside the opening 120a of the transfer guiding mold 120. In this case, the micro LEDs 131, 132, and 133 positioned above may be necessarily removed after the transfer process. In the example embodiment, the height H2 of the transfer guiding mold 120 may be less than twice the height H1 of the micro LEDs 131, 132, and 133 such that the micro LEDs 131, 132, and 133 positioned at positions away from the target position on the substrate 110 may be more easily removed.

FIG. 4 illustrates a display device according to another example embodiment. The display device according to the example embodiment has the same plane as illustrated in FIG. 1, and a cross section of one unit pixel 250 of the display device is illustrated in FIG. 4.

Referring to FIG. 4, the unit pixel 250 may include a first pixel 252, a second pixel 252, and a third pixel 253 of different colors. Here, the first pixel 251, the second pixel 252, and the third pixel 253 may be, for example, a blue pixel, a green pixel, and a red pixel, respectively.

The unit pixel 250 may include the substrate 110, the transfer guiding mold 120, and the plurality of micro LEDs 131, 132, and 133. The substrate 110 may be provided with the driving circuits 111 for driving the plurality of micro LEDs 131, 132, and 133.

The transfer guiding mold 120 may be provided on the upper surface of the substrate 110, and the openings 120a for receiving the micro LEDs 131, 132, and 133 may be formed in the transfer guiding mold 120. The driving circuits 111 provided on the substrate 110 may be exposed through the openings 120a of the transfer guiding mold 120.

The height H2 of the transfer guiding mold 120 may be less than twice the height H1 of the micro LEDs 131, 132, and 133. For example, the height H2 of the transfer guiding mold 120 may be about 0.5 to about 1.5 times the height H1 of the micro LEDs 131, 132, and 133, but is not limited thereto. A concave-convex structure 125 may be provided on the upper surface of the transfer guiding mold 120. The concave-convex structure 125 may be configured to more easily remove the unnecessary micro LEDs 131, 132, and 133 remaining on the upper surface of the transfer guiding mold 120a after a transfer process, as described below.

The plurality of micro LEDs 131, 132, and 133 may be provided on the upper surface of the substrate 110. For example, the plurality of micro LEDs 131, 132, and 133 may be provided on the driving circuits 111 of the substrate 110 exposed by the openings 120a of the transfer guiding mold 120. The plurality of micro LEDs 131, 132, and 133 may respectively include the first, second, and third micro LEDs 131, 132, 133 that emit light of different wavelength bands. For example, the first, second, and third micro LEDs 131, 132, and 133 may respectively emit light of colors corresponding to the first pixel 251, the second pixel 252, and the third pixel 253. The transfer guiding mold 120 may be provided to surround a periphery of the plurality of micro LEDs 131, 132, and 133. Here, the plurality of micro LEDs 131, 132, and 133 may be provided to be spaced apart from the transfer guiding mold 120.

In the example embodiment, the concave-convex structure 125 may be formed on the upper surface of the transfer guiding mold 120, such that the micro LEDs 131, 132, and 133 present on the upper surface of the transfer guiding mold 120 may be more effectively removed after the transfer process. Also, the height H2 of the transfer guiding mold 120 may be less than twice the height H1 of the micro LEDs 131, 132, and 133, such that the micro LEDs 131, 132, and 133 provided at positions away from a target position inside opening 120a of the transfer guiding mold 120 may be more easily removed.

Figure 5:
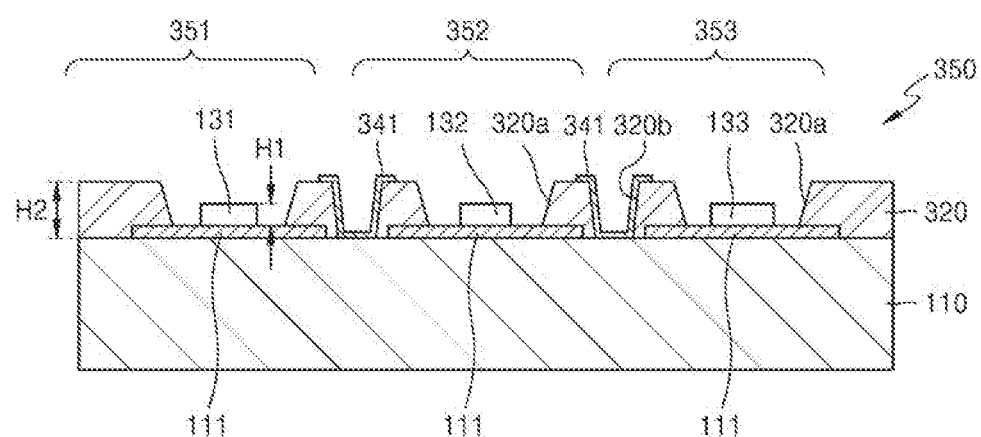
FIG. 5 illustrates a display device according to another example embodiment.

FIG. 5 illustrates a display device according to another example embodiment. The display device according to the example embodiment has the same plane as that shown in FIG. 1, and a cross section of one unit pixel 350 of the display device is illustrated in FIG. 5.

Referring to FIG. 5, the unit pixel 350 may include a first pixel 351, a second pixel 352, and a third pixel 353 of different colors. Here, the first pixel 351, the second pixel 352, and the third pixel 353 may be, respectively, for example, a blue pixel, a green pixel, and a red pixel.

The unit pixel 350 may include the substrate 110 provided with the driving circuits 111, a transfer guiding mold 320 provided on the substrate 110, the plurality of micro LEDs 131, 132, and 133 provided on the substrate 110, and a reflective layer 341 provided in the transfer guiding mold 320.

The transfer guiding mold 320 may be provided on the upper surface of the substrate 110, and openings 320a for receiving the micro LEDs 131, 132, and 133 may be formed in the transfer guiding mold 320. The driving circuits 111 provided on the substrate 110 may be exposed through the openings 320*a* of the transfer guiding mold 320. Here, a portion exposed by the opening 320*a* of the transfer guiding mold 320 may have an area corresponding to approximately one micro LED 131, 132, or 133.

The height H2 of the transfer guiding mold 320 may be less than twice the height H1 of the micro LEDs 131, 132, and 133. For example, the height H2 of the transfer guiding mold 320 may be about 0.5 to about 1.5 times the height H1 of the micro LEDs 131, 132, and 133, but is not limited thereto. The upper surface of the transfer guiding mold 320 may be provided with the concave-convex structure 125 as illustrated in FIG. 4 as described above.

The plurality of micro LEDs 131, 132, and 133 may be provided on the driving circuits 111 of the substrate 110 exposed by the openings 320*a* of the transfer guiding mold 320. The plurality of micro LEDs 131, 132, and 133 may respectively include the first, second, and third micro LEDs 131, 132, and 133 that emit light of different wavelength bands. The first, second, and third micro LEDs 131, 132, and 133 may emit light of colors corresponding to the first pixel 351, the second pixel 352, and the third pixel 353.

Figure 6:
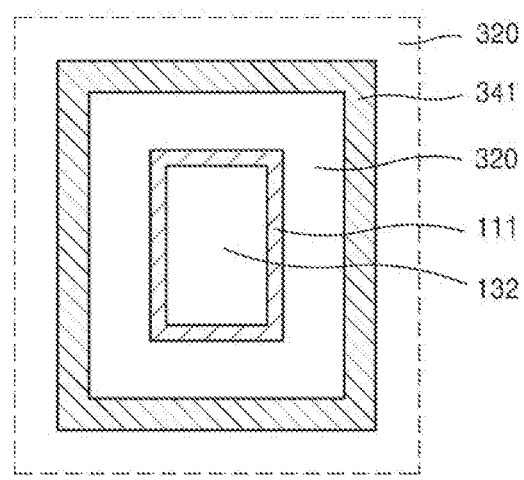
FIG. 6 illustrates a plan view illustrating a periphery of a micro LED of FIG. 5.

The plurality of micro LEDs 131, 132, and 133 may be provided inside each of the openings 320*a* of the transfer guiding mold 320. Here, the plurality of micro LEDs 131, 132, and 133 may be provided to be spaced apart from the transfer guiding mold 320. FIG. 6 illustrates an example of a plan view illustrating a periphery of the second micro LED 132. Referring to FIG. 6, the second micro LED 132 may be provided inside the transfer guiding mold 320. Here, the second micro LED 132 may be positioned to be spaced apart from the transfer guiding mold 320. In addition, like the second micro LED 132, the first micro LED 131 and the third micro LED 133 may be positioned to be spaced apart from the transfer guiding mold 320 inside the opening 320*a* of the transfer guiding mold 320.

The reflective layer 341 may be provided in the transfer guiding mold 320 between the plurality of micro LEDs 131, 132, and 133. Specifically, a groove 320*b* of a predetermined depth may be formed in the transfer guiding mold 320 between the plurality of micro LEDs 131, 132, and 133, and the reflective layer 341 may be provided on the inner wall of the groove 320*b*.

The reflective layer 341 may be provided to surround each of the plurality of micro LEDs 131, 132, and 133. Referring to FIG. 6, the reflective layer 341 may be provided in the transfer guiding mold 320*a* to surround the second micro LED 132. In addition, the reflective layer 341 may be provided to surround each of the first micro LED 131 and the third micro LED 133. The reflective layer 341 may include a metal material. For example, the reflective layer 341 may include aluminum (Al), silver (Ag), and the like, but is not limited thereto.

The reflective layer 341 may be configured to prevent or reduce mixing of light of different colors emitted from the adjacent pixels 351, 352, and 353. For example, light of a predetermined color emitted from the second micro LED 132 constituting the second pixel 352 may be reflected by the reflective layer 341 provided in the transfer guiding mold 320 to surround the second micro LED 132. Accordingly, the light of the predetermined color emitted from the second micro LED 132 may be prevented from traveling toward the adjacent first pixel 351 and third pixel 353. Thus, crosstalk between the adjacent pixels 351, 352 and 353 may be prevented or reduced from occurring.

In the example embodiment, the height H2 of the transfer guiding mold 320 may be less than twice the height H1 of the micro LEDs 131, 132, and 133 such that the micro LEDs 131, 132, and 133 provided at positions away from a target position on the substrate 110 may be more easily removed. In addition, when a concave-convex structure is formed on the upper surface of the transfer guiding mold 320, the micro LEDs 131, 132, and 133 provided on the upper surface of the transfer guiding mold 320 may be more effectively removed after the transfer process. The reflective layer 341 may be provided in the transfer guiding mold 320 between the plurality of micro LEDs 131, 132, and 133, and thus crosstalk between the adjacent pixels 351, 352, and 353 may be prevented or reduced from occurring.

Figure 7:
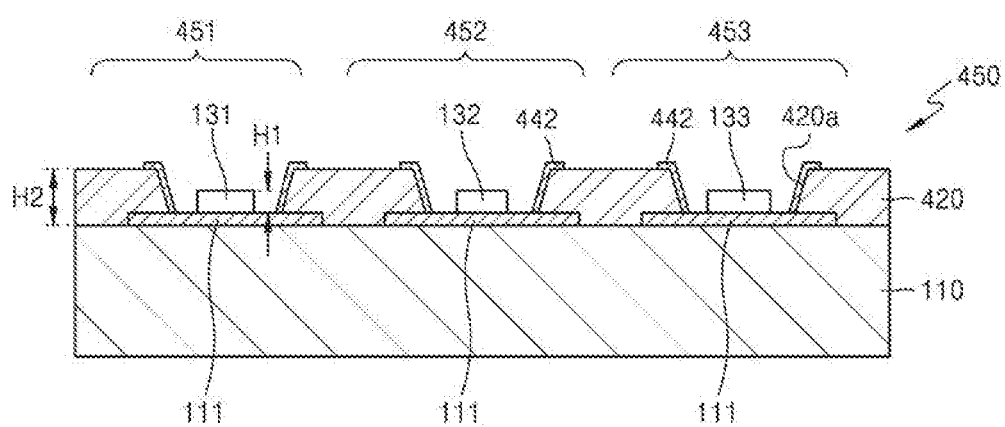
FIG. 7 illustrates a display device according to another example embodiment.

FIG. 7 illustrates a display device according to another example embodiment. The display device according to the example embodiment has the same plane as that shown in FIG. 1, and a cross section of one unit pixel 450 of the display device is illustrated in FIG. 7.

Referring to FIG. 7, the unit pixel 450 may include a first pixel 451, a second pixel 452, and a third pixel 453 of different colors. Here, the first pixel 451, the second pixel 452, and the third pixel 453 may be respectively, for example, a blue pixel, a green pixel, and a red pixel.

The unit pixel 450 may include the substrate 110 provided with the driving circuits 111, a transfer guiding mold 420 provided on the substrate 110, the plurality of micro LEDs 131, 132, and 133 provided on the substrate 110, and a reflective layer 442 provided on the transfer guiding mold 420.

Openings 420*a* for receiving the micro LEDs 131, 132, and 133 may be formed in the transfer guiding mold 420. The driving circuits 111 provided on the substrate 110 may be exposed through the openings 420*a* of the transfer guiding mold 420. Here, a portion exposed by the opening 420*a* of the transfer guiding mold 420 may have an area corresponding to approximately one micro LED 131, 132, or 133.

The height H2 of the transfer guiding mold 420 may be less than twice the height H1 of the micro LEDs 131, 132, and 133. For example, the height H2 of the transfer guiding mold 420 may be about 0.5 to about 1.5 times the height H1 of the micro LEDs 131, 132, and 133, but is not limited thereto. The upper surface of the transfer guiding mold 420 may be provided with the above-described concave-convex structure 125 as illustrated in (FIG. 4).

The plurality of micro LEDs 131, 132, and 133 may be provided in the driving circuits 111 of the substrate 110 exposed by the openings 420*a* of the transfer guiding mold 420. The plurality of micro LEDs 131, 132, and 133 may respectively include the first, second, and third micro LEDs 131, 132, and 133 that emit light of different wavelength bands. The first micro LED 131, the second micro LED 132, and the third micro LED 133 may respectively emit light of colors corresponding to the first pixel 351, the second pixel 352, and the third pixel 353.

Figure 8:
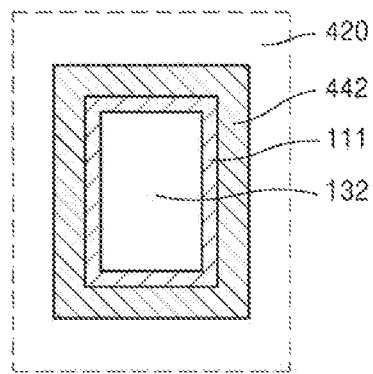
FIG. 8 illustrates a plan view illustrating a periphery of a micro LED of FIG. 7.

The plurality of micro LEDs 131, 132, and 133 may be provided inside each of the openings 420*a* of the transfer guiding mold 420. Here, the plurality of micro LEDs 131, 132, and 133 may be provided to be spaced apart from the transfer guiding mold 420. FIG. 8 illustrates an example of a plan view illustrating a periphery of the second micro LED 132. Referring to FIG. 8, the second micro LED 132 may be provided inside the transfer guiding mold 420. Here, the second micro LED 132 may be positioned to be spaced apart from the transfer guiding mold 420. In addition, like the second micro LED 132, the first micro LED 131 and the third micro LED 133 may be positioned to be spaced apart from the transfer guiding mold 420 inside the opening 420a of the transfer guiding mold 420.

The reflective layer 442 may be provided in the transfer guiding mold 420. For example, the reflective layer 442 may be provided on the inner wall of each of the openings 420a of the transfer guiding mold 420. Here, the reflective layer 442 may be provided to surround each of the plurality of micro LEDs 131, 132, and 133. Referring to FIG. 8, the reflective layer 442 may be provided in the transfer guiding mold 420 to surround the second micro LED 132. In addition, the reflective layer 442 may be provided to surround each of the first and third micro LEDs 131 and 133. The reflective layer 442 may include a metal material. For example, the reflective layer 442 may include Al, Ag, and the like, but is not limited thereto.

The reflective layer 442 may serve to prevent or reduce mixing of light of different colors emitted from the adjacent pixels 451, 452, and 453. Specifically, for example, light of a predetermined color emitted from the second micro LED 132 constituting the second pixel 452 may be reflected by the reflective layer 442 provided on the inner wall of the opening 420a of the opening guiding mold 420 to surround the second micro LED 132. Thus, the light of the predetermined color emitted from the second micro LED 132 may be prevented or reduced from traveling toward the adjacent first pixel 451 and the third pixel 453, and thus crosstalk between the adjacent pixels 451, 452 and 453 may be prevented or reduced from occurring.

In the example embodiment, the height H2 of the transfer guiding mold 420 may be less than twice the height H1 of the micro LEDs 131, 132, and 133 such that the micro LEDs 131, 132, and 133 provided at positions away from a target position on the substrate 110 may be more easily removed. In addition, when a concave-convex structure is formed on the upper surface of the transfer guiding mold 420, the micro LEDs 131, 132, and 133 provided on the upper surface of the transfer guiding mold 420 may be more effectively removed after a transfer process. In addition, the reflective layer 442 may be provided on the inner wall of the opening 420a of the transfer guiding mold 420, and thus crosstalk between the adjacent pixels 451, 452, and 453 may be prevented or reduced from occurring.

Figure 9:
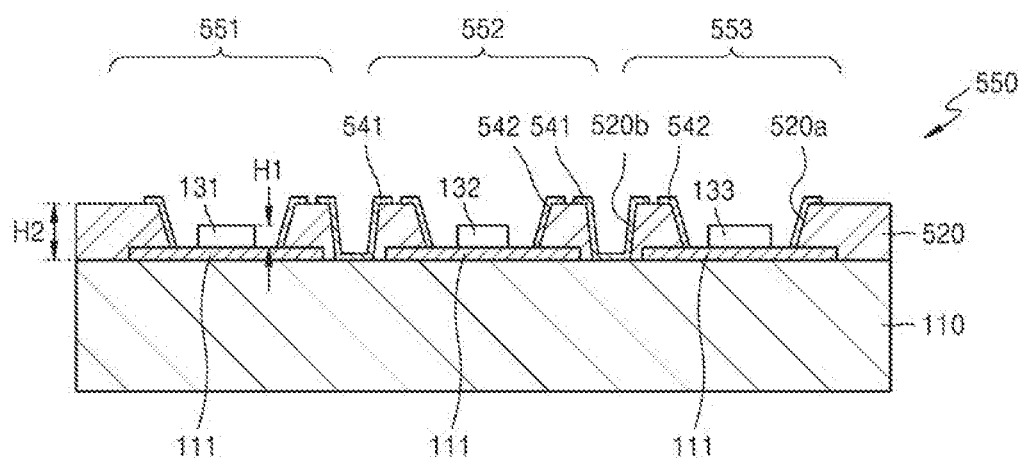
FIG. 9 illustrates a display device according to another example embodiment.

FIG. 9 illustrates a display device according to another example embodiment. The display device according to the example embodiment has the same plane as that shown in FIG. 1, and a cross section of one unit pixel 550 of the display device is illustrated in FIG. 9.

Referring to FIG. 9, the unit pixel 550 may include a first pixel 551, a second pixel 552, and a third pixel 553 of different colors. Here, the first pixel 551, the second pixel 552, and the third pixel 553 may be respectively, for example, a blue pixel, a green pixel, and a red pixel.

The unit pixel 550 may include the substrate 110 provided with the driving circuits, a transfer guiding mold 520 provided on the substrate 110, the plurality of micro LEDs 131, 132, and 133 provided on the substrate 110, and first reflective layer 541 and the second reflective layer 542 provided on the transfer guiding mold 520.

Openings 520a for receiving the micro LEDs 131, 132, and 133 may be formed in the transfer guiding mold 520. The driving circuits 111 provided on the substrate 110 may be exposed through the openings 520a of the transfer guide mold 520.

The height H2 of the transfer guiding mold 520 may be less than twice the height H1 of the micro LEDs 131, 132, and 133. For example, the height H2 of the transfer guiding mold 520 may be about 0.5 to about 1.5 times the height H1 of the micro LEDs 131, 132, and 133, but is not limited thereto. The upper surface of the transfer guiding mold 520 may be provided with the above-described concave-convex structure 125 as illustrated in FIG. 4.

The plurality of micro LEDs 131, 132, and 133 may be provided on the driving circuits 111 of the substrate 110 exposed by the openings 520a of the transfer guiding mold 520. The plurality of micro LEDs 131, 132, and 133 may respectively include the first micro LED 131, the second micro LED 132, and the third micro LED 133 that emit light of different wavelength bands. The first micro LED 131, the second micro LED 132, and the third micro LED 133 may emit light of colors corresponding to the first pixel 551, the second pixel 552, and the third pixel 553.

The plurality of micro LEDs 131, 132, and 133 may be provided inside each of the openings 520a of the transfer guiding mold 520. Here, the plurality of micro LEDs 131, 132, and 133 may be provided to be spaced apart from the transfer guiding mold 520.

The first reflective layer 541 may be provided in the transfer guiding mold 520 between the plurality of micro LEDs 131, 132, and 133. For example, a groove 520b of a predetermined depth may be formed in the transfer guiding mold 520 between the plurality of micro LEDs 131, 132, and 133, and the first reflective layer 541 may be provided on the inner wall of the groove 520b. The first reflective layer 541 may be provided to surround each of the plurality of micro LEDs 131, 132, and 133. The first reflective layer 541 may include, for example, a metal material such as Al, Ag, or the like.

The second reflective layer 542 may be provided on the inner wall of each of the openings 520a of the transfer guiding mold 520. Here, the second reflective layer 542 may be provided to surround each of the plurality of micro LEDs 131, 132, and 133. The second reflective layer 542 may include a metal material similar to the first reflective layer 541. The first reflective layer 541 and the second reflective layer 542 may more effectively prevent or reduce crosstalk between the adjacent pixels 551, 552, and 553 from occurring.

In the example embodiment, the height H2 of the transfer guiding mold 520 may be less than twice the height H1 of the micro LEDs 131, 132, and 133 such that the micro LEDs 131, 132, and 133 provided at positions away from a target position on the substrate 110 may be more easily removed. In addition, when a concave-convex structure is formed on the upper surface of the transfer guiding mold 520, the micro LEDs 131, 132, and 133 provided on the upper surface of the transfer guiding mold 520 may be more effectively removed after a transfer process. In addition, the first reflective layer 541 and the second reflective layer 542 may be provided in the transfer guiding mold 520, and thus crosstalk between the adjacent pixels 551, 552, and 553 may be more effectively prevented or reduced from occurring.

Figure 10:
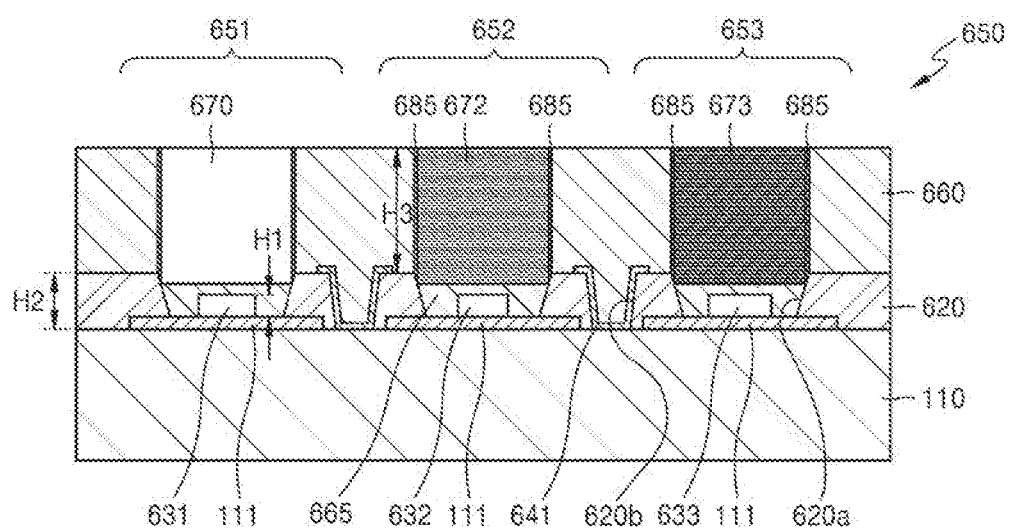
FIG. 10 illustrates a display device according to another example embodiment.

FIG. 10 illustrates a display device according to another example embodiment. The display device according to the example embodiment has the same plane as that shown in FIG. 1, and a cross section of one unit pixel 650 of the display device is illustrated in FIG. 10.

Referring to FIG. 10, the unit pixel 650 may include a first pixel 651, a second pixel 652, and a third pixel 653 of different colors. Here, the first pixel 651, the second pixel 652, and the third pixel 653 may be respectively, for example, a blue pixel, a green pixel, and a red pixel.

The substrate 110 may be provided with the driving circuits 111 for driving a plurality of micro LEDs 631, 632, and 633. The substrate 110 may include, for example, a glass substrate or a silicon substrate, but is not limited thereto.

A transfer guiding mold 620 may be provided on the upper surface of the substrate 110. Here, openings 620a for receiving the micro LEDs 631, 632, and 633 may be formed in the transfer guiding mold 620. The driving circuits 111 provided on the substrate 110 may be exposed through the openings 620a of the transfer guide mold 620. Here, a portion exposed by the opening 620a of the transfer guiding mold 620 may have an area corresponding to approximately one micro LED 631, 632, or 633.

The height H2 of the transfer guiding mold 620 may be less than twice the height H1 of the micro LEDs 631, 632, and 633. For example, the height H2 of the transfer guiding mold 620 may be about 0.5 to about 1.5 times the height H1 of the micro LEDs 631, 632 and 633, but is not limited thereto. A concave-convex structure may be provided on the upper surface of the transfer guiding mold 620.

The plurality of micro LEDs 631, 632, and 633 may be provided on the substrate 110, for example, on the driving circuits 111 exposed by the openings 620a of the transfer guiding mold 620. The plurality of micro LEDs 631, 632 and 633 may be provided to be spaced apart from the transfer guiding mold 620 inside each of the openings 620a of the transfer guiding mold 620.

In the example embodiment, the plurality of micro LEDs 631, 632, and 633 may respectively include the first micro LED 631, the second micro LED 632, and the third micro LED 633 which emit light of the same wavelength band. Here, the first micro LED 631, the second micro LED 632, and the third micro LED 633 may be respectively provided to correspond to the first pixel 651, the second pixel 652, and the third pixel 653. For example, the first, second, and third micro LEDs 631, 632, and 633 may emit light of a first color, for example, blue light.

A first reflective layer 641 may be provided in the transfer guiding mold 620 between the micro LEDs 631, 632, and 633. For example, a groove 620b of a predetermined depth may be formed in the transfer guiding mold 620 between the plurality of micro LEDs 631, 632 and 633, and the first reflective layer 641 may be provided on the inner wall of the groove 620b. The first reflective layer 641 may be provided to surround each of the plurality of micro LEDs 631, 632, and 633. The first reflective layer 641 may include, for example, a metal material such as Al, Ag, or the like. A reflective layer may be provided on the inner wall of the opening 620a of the transfer guiding mold 620.

A filling layer 665 may be provided in the opening 620a of the transfer guiding mold 620 to fill the micro LEDs 631, 632, and 633. Here, the filling layer 665 may include a material that transmits light emitted from the micro LEDs 631, 632 and 633.

A transparent material layer 670 may be provided on the first micro LED 631 provided to correspond to the first pixel 651. In addition, a barrier 660 that receives the transparent material layer 670 may be provided on the upper portion of the transfer guiding mold 620 surrounding the first micro LED 631. The barrier 660 may include the same material as the filling layer 665 described above, but is not limited thereto. A second reflective layer 685 may be provided on the inner wall of the barrier 660. The second reflective layer 685 may include, for example, a metal material, such as Al or Ag, similar to the first reflective layer 641, but is not limited thereto. Light of a first color, for example, blue light emitted from the first micro LED 631 may pass through the transparent material layer 670 and may be emitted from the first pixel 651.

A first photoconversion material layer 672 may be provided on the upper portion of the second micro LED 632 provided to correspond to the second pixel 652. Here, the first photoconversion material layer 672 may convert the wavelength of an incident light. Specifically, the first photoconversion material layer 672 may convert the light of the first color, for example, blue light emitted from the second micro LED 632 into light of a second color, for example, green light. The first photoconversion material layer 672 may include, but is not limited to, for example, quantum dots (QDs).

The barrier 660 that receives the first photoconversion material layer 672 may be provided on the upper portion of the transfer guiding mold 620 surrounding the second micro LED 632. In addition, the aforementioned second reflective layer 685 may be provided on the inner wall of the barrier 660. The light of the first color, for example, blue light emitted from the second micro LED 632 may be converted into the light of the second color, for example, green light by the first photoconversion material layer 672, and thus emitted from the second pixel 652.

A second photoconversion material layer 673 may be provided on the upper portion of the third micro LED 633 provided to correspond to the third pixel 653. Here, the second photoconversion material layer 673 may convert the wavelength of the incident light. For example, the second photoconversion material layer 673 may convert the light of the first color, for example, blue light emitted from the third micro LED 633 into light of a third color, for example, red light. The second photoconversion material layer 673 may include, but is not limited to, for example, QDs.

The barrier 660 that receives the second photoconversion material layer 673 may be provided on the upper portion of the transfer guiding mold 620 surrounding the third micro LED 633. In addition, the aforementioned second reflective layer 685 may be provided on the inner wall of the barrier 660. The light of the first color, for example, blue light emitted from the third micro LED 633 may be converted into the light of the third color, for example, red light by the second photoconversion material layer 673, and thus emitted from the third pixel 653.

The height H3 of the barrier 660 provided on the upper portion of the transfer guiding mold 620 to more effectively convert the first photoconversion material layer 672 and the second photoconversion material layer 673 received by the barrier 660 may be greater than the height H2 of the transfer guiding mold 620.

In the example embodiment, the height H2 of the transfer guiding mold 620 may be less than twice the height H1 of the micro LEDs 631, 632 and 633 such that the micro LEDs 631, 632 and 633 provided at positions away from a target position on the substrate 110 may be more easily removed. In addition, the first reflective layer 641 and the second reflective layer 685 may be provided in the transfer guiding mold 620 and the barrier 660, and thus crosstalk between the adjacent pixels 651, 652, and 653 may be more effectively prevented or reduced from occurring.

Figure 11:
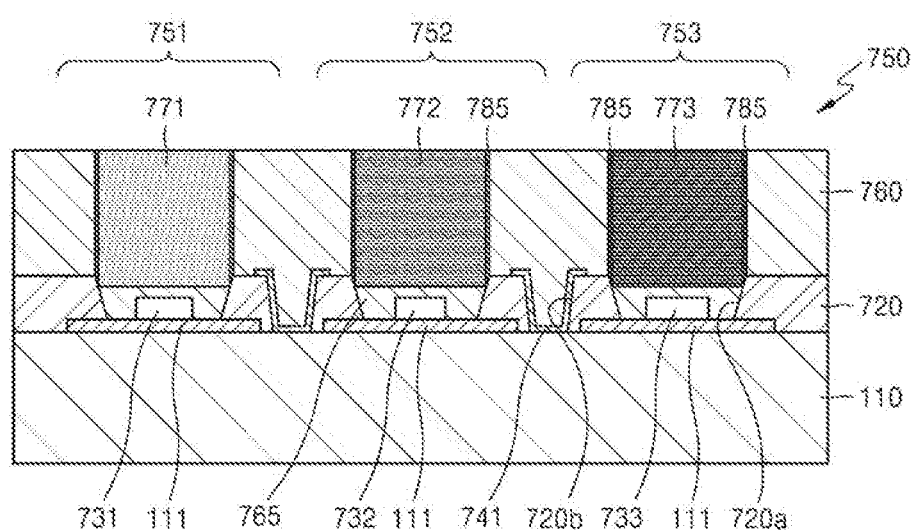
FIG. 11 illustrates a display device according to another example embodiment.

FIG. 11 illustrates a display device according to another example embodiment. The display device according to the example embodiment has the same plane as shown in FIG. 1, and a cross section of one unit pixel 750 of the display device is illustrated in FIG. 11.

Referring to FIG. 11, the unit pixel 750 may include a first pixel 751, a second pixel 752, and a third pixel 753 of different colors. Here, the first pixel 751, the second pixel 752, and the third pixel 753 may be respectively, for example, a blue pixel, a green pixel, and a red pixel.

The substrate 110 may be provided with the driving circuits 111 for driving a plurality of micro LEDs 731, 732, and 733, and a transfer guiding mold 720 may be provided on the upper surface of the substrate 110. Openings 720a for receiving the micro LEDs 731, 732, and 733 may be formed in the transfer guiding mold 720, and the driving circuits 111 provided on the substrate 110 may be exposed through the openings 720a.

The height of the transfer guiding mold 720 may be less than twice the height of the micro LEDs 731, 732, and 733. For example, the height of the transfer guiding mold 720 may be about 0.5 to about 1.5 times the height of the micro LEDs 731, 732 and 733, but is not limited thereto. A concave-convex structure may be provided on the upper surface of the transfer guiding mold 720.

The plurality of micro LEDs 731, 732, and 733 may be provided on the driving circuits 111 of the substrate 110 exposed by the openings 720a of the transfer guiding mold 720. The plurality of micro LEDs 731, 732, and 733 may be provided to be spaced apart from the transfer guiding mold 720 inside each of the openings 720a of the transfer guiding mold 720.

In the example embodiment, the plurality of micro LEDs 731, 732, and 733 may respectively include the first micro LED 731, the second micro LED 732, and the third micro LED 733 that emit light of the same wavelength band. The first micro LED 731, the second micro LED 732, and the third micro LED 733 may be provided to correspond to the first, second, and third pixels 751, 752, and 753 respectively. The first micro LED 731, the second micro LED 732, and the third micro LED 733 may emit, for example, ultraviolet light.

A first guiding layer 741 may be provided in the transfer guiding mold 720 between the plurality of micro LEDs 731, 732, and 733. For example, a groove 720b of a predetermined depth may be formed in the transfer guiding mold 720 between the plurality of micro LEDs 731, 732, and 733, and the first guiding layer 741 may be provided on the inner wall of the groove 720b. A reflective layer may be provided on the inner wall of the opening 720a of the transfer guiding mold 720. A filling layer 765 may be provided inside the opening 720a of the transfer guiding mold 720 to fill the micro LEDs 731, 732, and 733. Here, the filling layer 765 may include a material that transmits light emitted from the micro LEDs 731, 732, and 733.

A first photoconversion material layer 771 may be provided on the upper portion of the first micro LED 731 provided to correspond to the first pixel 751. Here, the first photoconversion material layer 771 may convert the wavelength of incident light. For example, the first photoconversion material layer 771 may convert light of a predetermined wavelength, for example, ultraviolet light emitted from the first micro LED 731 into light of a first color, for example, blue light. The first photoconversion material layer 771 may include, but is not limited to, for example, QDs.

A barrier 760 for receiving the first photoconversion material layer 771 may be provided on the upper portion of the transfer guiding mold 720 surrounding the first micro LED 731. A second reflective layer 785 may be provided on the inner wall of the barrier 760. The second reflective layer 785 may include, for example, a metal material, such as Al or Ag, like the first reflective layer 741, but is not limited thereto. The light of the predetermined wavelength emitted from the first micro LED 731, for example, ultraviolet rays may be converted into the light of the first color, for example, blue light by the first photoconversion material layer 771, and thus emitted from the first pixel 751.

A second photoconversion material layer 772 may be provided on the upper portion of the second micro LED 732 provided to correspond to the second pixel 752. Here, the second photoconversion material layer 772 may convert the wavelength of the incident light. For example, the second photoconversion material layer 772 may convert light of a predetermined wavelength, for example, ultraviolet light emitted from the second micro LED 732 into light of a second color, for example, green light. The second photoconversion material layer 772 may include, but is not limited to, for example, QDs.

The barrier 760 for receiving the second photoconversion material layer 772 may be provided on the upper portion of the transfer guiding mold 720 surrounding the second micro LED 732. In addition, the aforementioned second reflective layer 785 may be provided on the inner wall of the barrier 760. The light of the predetermined wavelength, for example, ultraviolet light emitted from the second micro LED 732 may be converted into the light of the second color, for example, green light by the second photoconversion material layer 772, and thus may be emitted from the second pixel 752.

A third photoconversion material layer 773 may be provided on the upper portion of the third micro LED 733 provided to correspond to the third pixel 753. Here, the third photoconversion material layer 773 may convert the wavelength of incident light. For example, the third photoconversion material layer 773 may convert light of a predetermined wavelength, for example, ultraviolet light emitted from the third micro LED 733 into light of a third color, for example, red light. The third photoconversion material layer 773 may include, but is not limited to, for example, QDs.

The barrier 760 for receiving the third photoconversion material layer 773 may be provided on the upper portion of the transfer guiding mold 720 surrounding the third micro LED 733. In addition, the aforementioned second reflective layer 785 may be provided on the inner wall of the barrier 760. The light of the predetermined wavelength, for example, ultraviolet light emitted from the third micro LED 733 may be converted into the light of the third color, for example, red light by the third photoconversion material layer 773 and thus emitted from the third pixel 753.

The height of the barrier 760 provided on the upper portion of the transfer guiding mold 720 in order for the first photoconversion material layer 771, the second photoconversion material layer 772, and the third photoconversion material layer 773 received by the barrier 760 to more effectively convert the incident light may be greater than the height of the transfer guiding mold 720.

In the example embodiment, the height of the transfer guiding mold 720 may be less than twice the height of the micro LEDs 731, 732, and 733 such that the micro LEDs 731, 732, and 733 provided at positions away from a target position on the substrate 110 may be more easily removed. In addition, the first reflective layer 741 and the second reflective layer 785 may be provided in the transfer guiding mold 720 and the barrier 760, and thus crosstalk between the adjacent pixels 751, 752, and 753 may be more effectively prevented or reduced from occurring.

In the above-described example embodiments, it is described that the unit pixel of the display device includes a plurality of pixels of different colors, for example, first pixel, the second pixel, and the third pixel of different colors. Here, one unit pixel includes only one pixel of the same color. However, the embodiments are not limited thereto, and two or more pixels of the same color may be included in one unit pixel.

Figure 12:
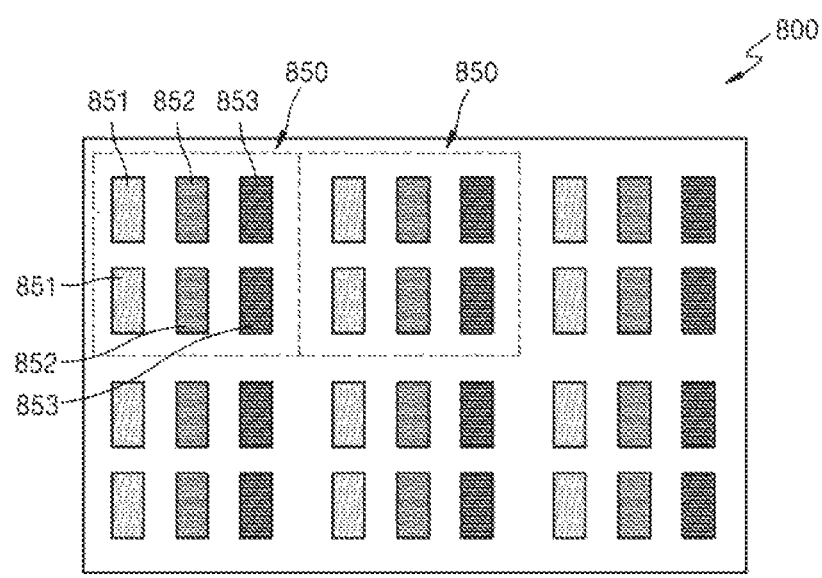
FIG. 12 is a plan view schematically illustrating a display device according to another example embodiment.

FIG. 12 is a plan view schematically illustrating a display device 800 according to another example embodiment.

Referring to FIG. 12, the display apparatus 800 may include a plurality of unit pixels 850. In FIG. 1, for example the 6 unit pixels 850 are illustrated. Here, each of the plurality of unit pixels 850 may include pixels 851, 852, and 853 of different colors. For example, each of the unit pixels 850 may include first pixel 851, a second pixel 852, and a third pixel 853 of different colors. Here, may have the same structure as first pixel, the second pixel, and the third pixel described in the above-described example embodiments. Thus, detailed descriptions thereof will be omitted.

In the example embodiment, the unit pixel 850 may include two pixels of the same color. For example, the unit pixel 850 may include two first pixels 851, two second pixels 852, and two third pixels 853. Here, the first pixel 851, the second pixel 852, and the third pixel 853 may be respectively, for example, a blue pixel, a green pixel, and a red pixel.

As described above, when the unit pixel 850 includes the two pixels 851, 852 and 853 of the same color, and thus a color image may be normally implemented without having to repair a defective pixel even when any one of the two pixels 851, 852 and 853 of the same color is defective.

The case in which the unit pixel 850 includes the two pixels 851, 852, and 853 of the same color is described as an example, but is not limited thereto. The unit pixel 850 may include three or more pixels of the same color.

According to the display device according to the example embodiment described above, the height of a transfer guiding mold that guides transfer of a plurality of micro LEDs may be less than twice the height of the micro LEDs such that the micro LEDs provided at positions away from a target position on a substrate may be more easily removed. In addition, a concave-convex structure may be formed on the surface of the transfer guiding mold, and thus the micro LEDs remaining on the surface of the transfer guiding mold may be more easily removed. A reflective layer may be provided on the transfer guiding mold, and thus crosstalk between adjacent pixels may be effectively prevented or reduced from occurring.

Although the example embodiments have been described above, the present disclosure is not limited thereto, and various modifications may be made by those skilled in the art.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A display device comprising:
   a substrate;
   a transfer guiding mold provided on the substrate and comprising a plurality of openings;
   a plurality of micro light emitting diodes (LEDs) provided on the substrate in the plurality of openings,
   wherein the transfer guiding mold is configured to guide a movement of the micro LEDs in a process of transferring the micro LEDs of the substrate,
   wherein a height of the transfer guiding mold is less than twice a height, but greater than a single height, of each of the plurality of micro LEDs.

2. The display device of claim 1, further comprising a plurality of driving circuits configured to drive the plurality of micro LEDs, respectively,
   wherein each of the plurality of driving circuits are provided on the substrate and a portion of each of the plurality of driving circuits are exposed through the plurality of openings, respectively, of the transfer guiding mold.

3. The display device of claim 1, wherein the plurality of micro LEDs are provided to be spaced apart from the transfer guiding mold.

4. The display device of claim 1, further comprising a first reflective layer provided on the transfer guiding mold between the plurality of micro LEDs.

5. The display device of claim 1, further comprising a second reflective layer provided on an inner wall of an opening provided in the transfer guiding mold.

6. The display device of claim 1, further comprising a concave-convex structure provided on an upper surface of the transfer guiding mold.

7. The display device of claim 1, further comprising a plurality of unit pixels each comprising a plurality of pixels of different colors.

8. The display device of claim 7, wherein each of the plurality of unit pixels comprises two or more pixels of a same color.

9. The display device of claim 7, wherein the plurality of pixels of different colors comprises a plurality of micro LEDs configured to emit light of different wavelength bands.

10. The display device of claim 7, wherein the plurality of pixels of different colors comprises a plurality of micro LEDs configured to emit light of a same wavelength band, and at least some of the plurality of micro LEDs are provided with a photoconversion material layer configured to convert a wavelength of an incidence light.

11. The display device of claim 10, further comprising a barrier provided on an upper portion of the transfer guiding mold, the barrier being configured to receive the photoconversion material layer.

12. The display device of claim 11, further comprising a reflective layer provided on an inner wall of the barrier.

13. The display device of claim 11, wherein a height of the barrier is greater than the height of the transfer guiding mold.

* * * * *